(12) United States Patent
Yedidia et al.

(10) Patent No.: US 6,857,097 B2
(45) Date of Patent: Feb. 15, 2005

(54) EVALUATING AND OPTIMIZING ERROR-CORRECTING CODES USING A RENORMALIZATION GROUP TRANSFORMATION

(75) Inventors: Jonathan S. Yedidia, Cambridge, MA (US); Jean-Philippe M. Bouchaud, Sceaux (FR)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 368 days.

(21) Appl. No.: 09/858,358

(22) Filed: May 16, 2001

(65) Prior Publication Data

US 2003/0014717 A1 Jan. 16, 2003

(51) Int. Cl.[7] .............................................. H03M 13/00
(52) U.S. Cl. ...................................... 714/752; 714/804
(58) Field of Search ................................. 714/804, 777, 714/752, 746

(56) References Cited

U.S. PATENT DOCUMENTS

| | | | | | |
|---|---|---|---|---|---|
| 4,295,218 A | * | 10/1981 | Tanner | ........................ | 714/762 |
| 5,590,248 A | * | 12/1996 | Zarge et al. | ................. | 345/421 |
| 6,073,250 A | * | 6/2000 | Luby et al. | .................. | 714/755 |

FOREIGN PATENT DOCUMENTS

| | | | | |
|---|---|---|---|---|
| JP | 1160678 A | 12/2001 | ........... | G06F/17/10 |

OTHER PUBLICATIONS

Mathworld, Graph Loop definition, Mathworld.com.*
Mathworld, Graph Cycle definition, Mathworld.com.*
Mathworld, Bipartite Graph definition, Mathworld.com.*

Schikore et al., "Decimation of 2d scalar data with error control," Feb. 1995, pp 1–6.*

Etzion et al. "Which codes have cycle–free tanner graphs," Sep. 1999, IEEE transactions on information theory, vol. 45, No. 6, pp. 2173–2181.*

Nijman et al., "Efficient learning in sparsely coonnected boltzmann machines," 1996, pp. 1–7.*

Steedly et al. "A modified TLS–Prony method using data decimation," 1992, pp 1–17.*

(List continued on next page.)

*Primary Examiner*—Guy J. Lamarre
(74) *Attorney, Agent, or Firm*—Dirk Brinkman; Andrew Carton

(57) ABSTRACT

A method evaluates an error-correcting code for a data block of a finite size. An error-correcting code is defined by a parity check matrix, wherein columns represent variable bits and rows represent parity bits. The parity check matrix is represented as a bipartite graph. A single node in the bipartite graph is iteratively renormalized until the number of nodes in the bipartite graph is less than a predetermine threshold. During the iterative renormalization, a particular variable node is selected as a target node, and a distance between the target node and every other node in the bipartite graph is measured. Then, if there is at least one leaf variable node, renormalize the leaf variable node farthest from the target node, otherwise, renormalize a leaf check node farthest from the target node, and otherwise renormalize a variable node farthest from the target node and having fewest directly connected check nodes. By evaluating many error-correcting codes according to the method, an optimal code according to selected criteria can be obtained.

16 Claims, 14 Drawing Sheets

OTHER PUBLICATIONS

Stefan Rüger, Efficient Inference and Learning in Decmatable Boltzmann Machines, Feb. 7, 1997, pp. 1–4 and 8–14.* http://www.mathworld.com, Graph Loop, 1990, http://mathworld.wolfram.com/GraphLoop.html.* http://www.mathworld.com, Bipartite Graph, 1985, http://mathworld.wolfram.com/BipartiteGraph.html.*

David MacKay, Relationships between Sparse Graph Codes, Jul. 17–18, 2000, Information–Based Induction Sciences (IBIS 2000 Shizuoka, Japan), pp. 1–4.*

R. Michael Tanner, A recursive approach to low complexity codes, Sep. 1981, IEEE Transactions on Information Theory, vol. IT–27, No. 5, pp. 534–537.*

R. Michael Tanner, Minimum Distance Bounds by Graph Analysis, Jul. 26, 2000, pp. 2–4.*

Stefan M. Rüger, Decimaable Boltzmann Machines for Diagnosis: Efficient Learning and Inference, 1997, pp. 1–6.*

Thomas J. Richardson et al, Design of Capacity–Approaching Irregular Low–Density Parity–Check Codes, Feb. 2001, IEEE Transactios on Information Theory, vol. 47, No. 2, pp. 1–3.*

Sae–Young Chung, Thomas J Richardson, Rudiger L Urbanke, Analysis of Sum–Product Decoding of Low–Density Parity Check Codes Using a Gaussian Approximation, Feb. 2001, IEEE Transactions on Information Theory, vol. 47 No. 2, pp. 657–660.*

Weiberg, N. "Codes and Decoding on General Graphs," Linkoeping Studies in Science and Technology, No. 440, pp. 1–95, 1996.

Weiss, Y. "Correctness of Local Probability Propagation in Graphical Models with Loops," Neural Computation, MIT Press, vol. 12, No. 1, pp. 1–41, 2000.

Weiss, Y. "On the Optimality of Solutions of the Max–Product Belief–Propagation Algorithm in Arbitrary Graphs," IEEE Transactions on Information Theory, vol. 47, No. 2, pp. 736–744, 2001.

Richardson et al., "The Capacity of Low–Density Parity-Check Codes under Message–Passing Decoding," IEEE Transactions on Information Theory, vol. 47, No. 2, pp. 599–618, 2001.

* cited by examiner

100

301

302

303

EVALUATING AND OPTIMIZING ERROR-CORRECTING CODES USING A RENORMALIZATION GROUP TRANSFORMATION

FIELD OF THE INVENTION

The present invention relates generally to the field of error-correcting codes for data storage and data transmission, and more particularly to evaluating and optimizing error-correcting codes for intermediate length data blocks.

BACKGROUND OF THE INVENTION

A fundamental problem in the field of data storage and communication is generating optimal or near optimal error-correcting codes (ECC) for data of a given block-length and transmission rate that can also be practically decoded. This problem is now nearly solved for small block-lengths, e.g., blocks of length N<100 bits, and for very large block-lengths, e.g., N>$10^6$ bits. However, error-correcting codes that are used in many applications, for example, wireless communication, typically have block-lengths in an intermediate range, around N=2000 bits. Generating optimal codes for these block-length remains a problem.

A large number of error-correcting codes are known for small block-lengths, many of which are known to be optimal, or near optimal. As long as the block-length is small enough, these ECC can be decoded practically and optimally using maximum-likelihood decoders.

The problem of finding optimal codes for very large block-lengths has been essentially solved by parity-check codes defined by generalized parity check matrices. These types of codes were first described by R. G. Gallager, in "Low-density parity check codes," Vol.21, Research Monograph Series, MIT Press, 1963, but were not properly appreciated until recently. More recently, improved codes defined by sparse generalized parity check matrices have been described, such as turbocodes, irregular low-density parity check (LDPC) codes, Kanter-Saad codes, repeat-accumulate codes, and irregular repeat-accumulate codes.

These improved codes have three particularly noteworthy advantages. First, the codes can be decoded efficiently using belief propagation (BP) iterative decoding. Second, the performance of these codes can often be theoretically analyzed using a density evolution method, in an infinite-block-length limit. Third, by using a density evolution method, it can be demonstrated that these codes are nearly optimal codes. In the infinite-block-length limit, BP decoding of these codes decodes all data blocks that have a noise level below some threshold level, and that threshold level is often not far from the Shannon limit.

The preferred prior art way for generating improved codes has been to optimize codes for the infinite block-length limit using density evolution, and hope that a scaled-down version still results in a near optimal code. The problem with this method is that for N<$10^4$, at least, the block-length is still noticeably far from the infinite-block-length limit. In particular, many decoding failures are found at noise levels far below the threshold level predicted by infinite block-length calculations. Furthermore, there may not necessarily even exist a way to scale down the codes derived from the density evolution method.

For example, the best known irregular LDPC codes, at a given rate in the N→∞ limit, often have variable nodes that should participate in hundreds or even thousands of parity checks, which makes no sense when the overall number of parity checks is 100 or less.

Density Evolution Method for a Binary Erasure Channel (BEC)

The density evolution method is simple for a binary erasure channel. A binary erasure channel is a binary input channel with three output symbols: 0, 1, and an erasure, which can be represented by a question mark "?." Because this method is important background information for the method according to the invention, it is distinguished in greater detail.

Parity Check Codes

Linear block binary error-correcting codes can be defined in terms of a parity check matrix. In a parity check matrix A, the columns represent transmitted variable bits, and the rows define linear constraints or checks between the variable bits. More specifically, the matrix A defines a set of valid vectors or codewords z, such that each component of z is either 0 or 1, and $$Az=0 \qquad (1)$$

where all multiplication and addition are modulo 2.

If the parity check matrix has N columns and N-k rows, then the parity check defines an error correcting code of block-length N and transmission rate k/N, unless some of the rows are linearly dependent, in which case some of the parity checks are redundant, and the code actually has a higher transmission rate.

As shown in FIG. 1, there is a corresponding Tanner graph for each parity check matrix, see R. M. Tanner, "A recursive method to low complexity codes," IEEE Trans. Info. Theory, IT-27, pages 533–547, 1981. The Tanner graph 100 is a bipartite graph with two types of nodes: variable nodes i denoted by circles, and check nodes a denoted by squares. In the Tanner graph, each variable node is connected to the check node participating in the check for the variable node i.

For example, the parity check matrix $$A = \begin{pmatrix} 1 & 1 & 0 & 1 & 0 & 0 \\ 1 & 0 & 1 & 0 & 1 & 0 \\ 0 & 1 & 1 & 0 & 0 & 1 \end{pmatrix} \qquad (2)$$

is represented by the bipartite Tanner graph shown in FIG. 1.

It should be understood, that in practical applications the graphs typically include thousands of nodes connected in any number of different ways, and containing many cycles. Analyzing such graphs to determine optimal configurations is difficult.

Error-correcting codes defined by parity check matrices are linear. This means that each codeword is a linear combination of other codewords. In a check matrix, there are $2^k$ possible codewords, each of length N. For the example given the above, the codewords are 000000, 001011, 010110, 011101, 100110, 101101, 110011, 111000. Because of the linearity property, any of the codewords are representative. For the purposes of analyzing a code, it is therefore normally assumed that the all-zeros codeword is transmitted.

Belief Propagation Decoding in the BEC

An input bit passes through the binary erasure channel as an erasure with probability x and is received correctly with probability 1−x. It is important to note that the BEC never flips bits from 0 to 1, or vice versa. If all-zeros codewords are transmitted, the received word must consist entirely of zeros and erasures.

The receiver uses a belief propagation (BP) decoder to decode the input bits by passing discrete messages between the nodes of the Tanner graph. A message $m_{ia}$ is sent from each variable node i to each check node a connected to it. The message represents the state of the variable node i. In general, the message can be in one of three states: 1, 0, or ?, but because the all-zeros codeword is always transmitted, the possibility that $m_{ia}$ has value 1 can be ignored.

Similarly, there is a message $m_{ai}$ sent from each check node a to all the variable nodes i connected to the check node. These messages are interpreted as directives from the check node a to the variable node i about what state the variable node should be in. This message is based on the states of the other variable nodes connected to the check node. The check-to-variable messages can, in principle, take on the values 0, 1, or ?, but again only the two messages 0 and ? are relevant when the all-zeros codeword is transmitted.

In the BP decoding process for the BEC, a message $m_{ia}$ from a variable node i to a check node a is equal to a non-erasure received message because such messages are always correct in the BEC, or to an erasure when all incoming messages are erasures. A message $m_{ai}$ from a check node a to a variable node i is an erasure when any incoming message from another node participating in the check is an erasure; otherwise it takes on the value of the binary sum of all incoming messages from other nodes participating in the check.

BP decoding is iterative. The messages are initialized so that all variable nodes that are not erased by the channel send out messages equal to the corresponding received bit, and all other messages are initially erasures. Iterating the BP message process converges eventually to stationary messages because convergence of BP decoding is guaranteed for the particularly simple BEC, though not for other channels. The final decoded value of any erased variable node is just the value of any non-erasure message coming into that node, unless there is no incoming non-erasure message. In this case, the BP decoding process terminates and fails to decode the particular variable node.

Density Evolution

The average probability of failure for BP decoding over many blocks is now considered. A real number $p_{ia}$, which represents the probability that the message $m_{ia}$ is an erasure, is associated with each message $m_{ia}$. Similarly, a real number $q_{ai}$, which represents the probability that the message $m_{ai}$ is an erasure, is associated with each message $m_{ai}$. In the density evolution method, probabilities $p_{ia}$ and $q_{ai}$ are determined in a way that is exact, as long as the Tanner graph representing the error-correcting code has no cycles.

The equation for $p_{ia}$ is $$p_{ia} = x \prod_{b \in N(i) \backslash a} q_{bi}, \qquad (3)$$

where $b \in N(i) \backslash a$ represents all check nodes directly connected to a neighboring variable node i, except for check node a. This equation can be derived from the fact that for a message $m_{ia}$ to be an erasure, the variable node i must be erased in transmission, and all incoming messages from other check nodes are erasures as well. Of course, if the incoming messages are correlated, then this equation is not correct. However, in a Tanner graph with no cycles, each incoming message is independent of all other messages.

Similarly, the equation $$q_{ai} = 1 - \prod_{j \in N(a) \backslash i} (1 - p_{ja}) \qquad (4)$$

can be derived from the fact that a message $m_{ai}$ can only be in a 0 or 1 state when all incoming messages are in either a zero or one state.

The density evolution equations (3) and (4) can be solved by iteration. A good initialization is $p_{ia}=x$ for all messages from variable nodes to check nodes and $q_{ai}=0$ for all messages from check nodes to variable nodes, as long as the iteration begins with the $m_{ai}$ messages. The BEC density evolution equations ultimately converge. This can be guaranteed for codes defined in graphs without cycles. It is possible to determine $b_i$, which is the probability of a failure to decode at variable node i, from the formula $$b_i = x \prod_{a \in N(i)} q_{ai}. \qquad (5)$$

Exact Solution of a Small Code

As stated above, the density evolution equations (3, 4, and 5) are exact when the code has a Tanner graph representation without cycles.

Consider the error-correcting code defined by a parity check matrix $$A = \begin{pmatrix} 1 & 1 & 0 & 0 \\ 0 & 1 & 1 & 1 \end{pmatrix} \qquad (6)$$

and represented by a corresponding Tanner graph shown in FIG. 2. This code has four codewords: 0000, 0011, 1101, and 1110. If the 0000 message is transmitted, then there are sixteen possible received messages: 0000, 000?, 00?0, 00??, 0?00, and so on. The probability of receiving a message with $n_e$ erasures is $x^{n_e}(1-x)^{4-n_e}$. Messages might be partially or completely decoded by the BP decoder; for example the received message ?00? is fully decoded to 0000, but the message 0??? is only partially decoded to 00??, because there is not enough information to determine whether the transmitted codeword was actually 0000 or 0011.

It is easy to determine the exact probability that a given bit remains an erasure after decoding by summing over the sixteen possible received messages weighted by their probabilities. For example, the first bit is only decoded as an erasure when one of the following messages is received: ???0, ??0?, or ????, so the correct probability that the first bit is not decoded is $2x^3(1-x)+x^4=2x^3-x^4$.

If the focus is on the last bit, then the message is decoded, unless one of the following messages is sent: 00??, 0???, ?0??, ??0? or ????. Therefore, the overall probability that the fourth bit is not decoded is $x^2(1-x)^2+3x^3(1-x)+x^4=x^2+x^3-x^4$. In the density evolution method, the values for the following variables:

$p_{11}, p_{21}, p_{22}, p_{32}, p_{42}, q_{11}, q_{12}, q_{22}, q_{23}, q_{24}, b_1, b_2, b_3, b_4$ are determined by equations $p_{11}=x$ \hfill (7)

$p_{21}=xq_{22}$ \hfill (8)

$p_{22}=xq_{12}$ \hfill (9)

$p_{32}=x$ \hfill (10)

$p_{42}=x$ (11a)

$q_{11}=p_{21}$ (11b)

$q_{12}=p_{11}$ (12)

$q_{22}=1-(1-p_{32})(1-p_{42})$ (13)

$q_{23}=1-(1-p_{22})(1-p_{42})$ (14)

$q_{24}=1-((1-p_{32})(1-p_{22}))$ (15)

and $b_1=xq_{11}$ (16)

$b_2=xq_{12}q_{22}$ (17)

$b_3=xq_{23}$ (18)

$b_4=xq_{24}$. (19)

Solving these equations yields $p_{11}=x$ (20)

$p_{21}=2x^2-x^3$ (21)

$p_{22}=x^2$ (22)

$p_{32}=x$ (23)

$p_{42}=x$ (24)

$p_{11}=2x^2-x^3$ (25)

and $q_{12}=x$ (26)

$q_{22}=2x-x^2$ (27)

$q_{23}=x+x^2-x^3$ (28)

$q_{24}=x+x^2-x^3$ (29)

and $b_1=2x^3-x^4$ (30)

$b_2=2x^3-x^4$ (31)

$b_3=x^2+x^3-x^4$ (32)

$b_4=x^2+x^3-x^4$ (33)

Examining the results for $b_1$ and $b_4$ indicates that the density evolution solution agrees exactly with the direct approach for this code.

The Large Block-length Limit

If all local neighborhoods in the Tanner graph are identical, the density evolution equations can be simplified. For example, if each variable node i is connected to $d_v$ check nodes, and each check node a is connected to $d_c$ variable nodes, then all the $p_{ia}$ are equal to the same value p, all the $q_{ai}$ are equal to the same value q, and all the $b_i$ are equal to the same value b. Then, $p=xq^{d_v-1}$ (34)

$q=1-(1-p)^{d_c-1}$ (35)

and $b=xq^{d_v}$ (36)

which are the density evolution equations for $(d_v, d_c)$ regular Gallager codes, valid in the N→∞ limit. A regular Gallager code is a sparse random parity check matrix characterized by the restriction that each row has exactly $d_c$ ones in it, and each column contains exactly $d_v$ ones.

The intuitive reason that these equations are valid, in the infinite block-length limit, is that as N→∞, the size of typical cycles in the Tanner graph of a regular Gallager code go to infinity, so all incoming messages to a node are independent, and a regular Gallager code behaves as a code defined on a graph without cycles. Solving equations (34 and 35) for specific values of $d_v$ and $d_c$ yields a solution that is p=q=b=0, below a critical erasure limit of $x_c$. This means that decoding is perfect. Above $x_c$, b has a non-zero solution, which correspond to decoding failures. The value $x_c$ is easy to determine numerically. For example, if $d_v=3$ and $d_c=5$, then $x_c \approx 0.51757$.

These density evolution calculations can be generalized to irregular Gallager codes, or other codes like irregular repeat-accumulate codes which have a finite number of different classes of nodes with different neighborhoods. In this generalization, one can derive a system of equations, typically with one equation for the messages leaving each class of node. By solving the system of equations, one can again find a critical threshold $x_c$, below which decoding is perfect. Such codes can thus be optimized, in the N→∞ limit, by finding the code that has maximal noise threshold $x_c$.

Unfortunately, the density evolution method is erroneous for codes with finite block-lengths. One might think that it is possible to solve equations (3 and 4) for any finite code, and hope that ignoring the presence of cycles is not too important a mistake. However, this does not work out, as can be seen by considering regular Gallager codes. Equations (3, 4, and 5) for a finite block-length regular Gallager code have exactly the same solutions as one would find in the infinite-block-length limit, so one would not predict any finite-size effects. However, it is known that the real performance of finite-block-length regular Gallager codes is considerably worse than that predicted by such a naive method.

Therefore, there is a need for a method to correctly evaluate finite length error-correcting codes that do not suffer from the problems of the prior art methods.

SUMMARY OF THE INVENTION

The present invention provides a method for evaluating an error correcting code for a data block of a finite size in a binary erasure channel or an additive white Gaussian noise channel. An error-correcting code is defined by a generalized parity check matrix, wherein columns represent variable bits and rows represent parity bits. In a notation of the matrix, "hidden" variable bits which are not transmitted through the channel are represented by a bar over the corresponding column of the generalized parity check matrix. The generalized parity check matrix is represented as a bipartite graph. A single node in the bipartite graph is iteratively renormalized until the number of nodes in the bipartite graph is less than a predetermined threshold.

During the iterative renormalization, a particular variable node is selected as a target node, and a distance between the target node and every other node in the bipartite graph is measured. Then, if there is at least one "leaf" variable node, renormalize a leaf variable node farthest from the target node, otherwise, renormalize a leaf check node farthest from the target node, and otherwise renormalize a variable node farthest from the target node and having fewest directly connected check nodes. Leaf nodes are connected to only one other node in the graph.

When the number of nodes in the graph is less than the predetermined threshold, the decoding failure rate for the target node is determined exactly.

The present invention provides a method for optimizing error-correcting codes by searching for the error-correcting code of a specified data block size and transmission rate with the best performance in terms of decoding failure as a function of noise. The decoding failure rates for transmitted variable bits are used to guide the search for an optimal code.

DETAILED DESCRIPTION OF THE PREFERRED EMBODIMENT

Renormalization Group Method

Our invention evaluates error-correcting codes by using "real-space" renormalization group transformations. Our renormalization group (RG) method is adapted from techniques for the analysis of magnetic spin systems described by T. Niemeijer and J. M. J. van Leeuwen in "Phase Transitions and Critical Phenomena," C. Domb and M. S. Green editors, Vol. 6, Academic Press, London, 1976. Renormalization groups have never been applied to error-correcting codes used to store and transmit data.

To evaluate the performance of a large but finite error-correcting code, we iteratively replace the large code with a slightly smaller code that has the same or nearly the same performance, i.e., decoding failure rate. In particular, at each step in our iterative method, we keep a Tanner graph and a set of probability variables $p_{ia}$ and $q_{ai}$ associated with messages transmitted by the nodes of the graph. For the purpose of describing the present invention, we call the combination of the Tanner graph and the p and q variables a "decorated Tanner graph."

The basis of our RG method is the RG transformation by which we iteratively eliminate single nodes in the decorated Tanner graph, and adjust the remaining values of the p and q messages so that the smaller error-correcting code has a decoding failure rate as close as possible to the replaced code.

Thus, with each renormalization step, the decorated Tanner graph representing our code shrinks by one node, until the graph is finally small enough that the performance of the error-correcting code can be determined in an efficient manner. In contrast, prior art density evolution methods never change the number of nodes, or the way the nodes are connected to each other. In other words, their graphs are static, while our graphs change dynamically during renormalization. When our graph is small enough, e.g., when the number of remaining nodes is less than a predetermined threshold, the failure rate can readily be determined. In one embodiment, we reduce the graph down to a single node.

Figure 9:
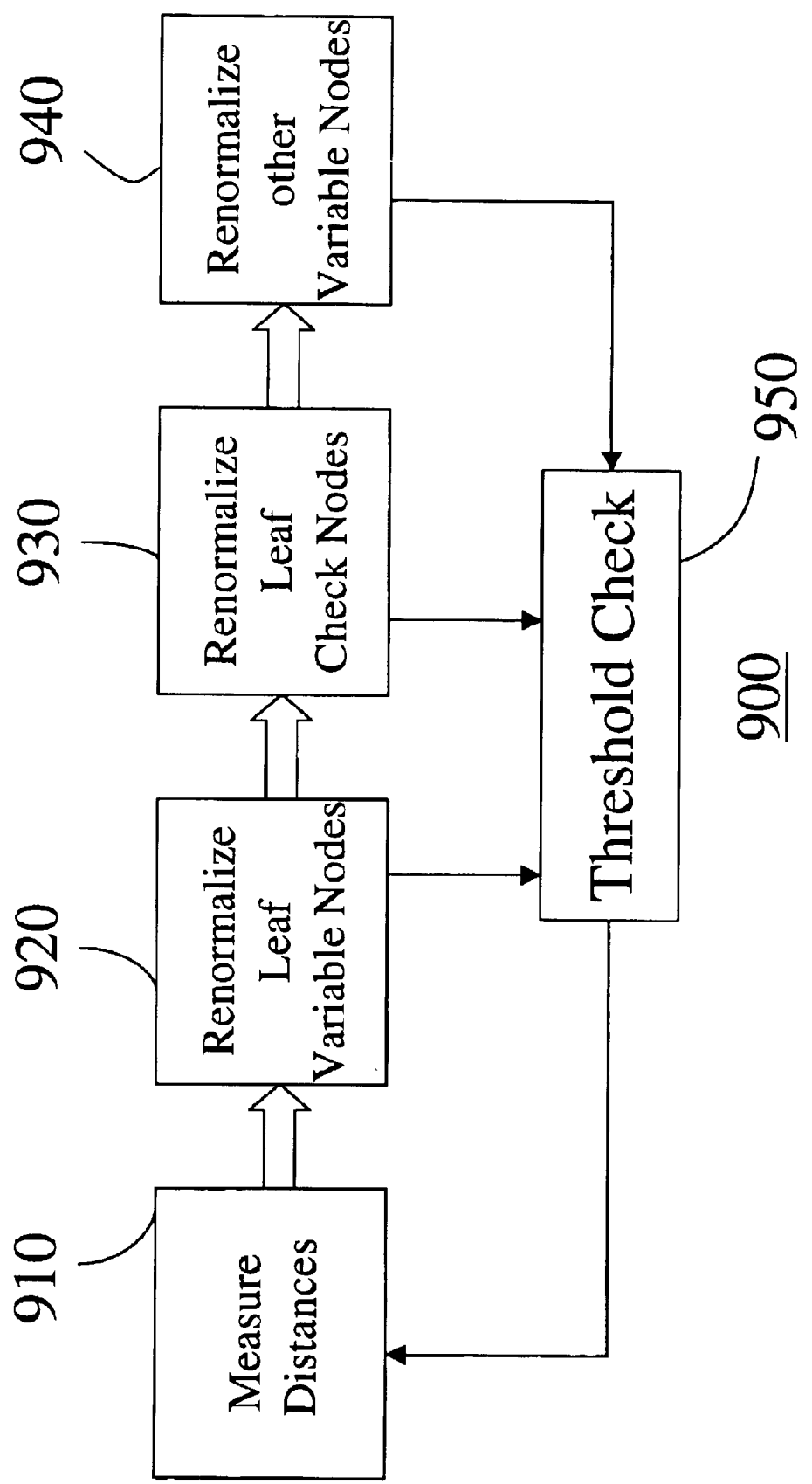
FIG. 9 is a flow diagram of a renormalization group method according to the invention.

FIG. 9 shows the steps of the general method 900 according to our invention. For each selected "target" variable node i in our decorated Tanner graph for which the decoding failure rate $b_i$ is to be determined, repeatedly renormalize a single node from the graph, other than the target node, until a predetermined threshold 950 is reached. The threshold can either be expressed as a desired number of nodes, or a desired failure rate for the remaining node. Nodes are renormalized as follows.

Measure 910 the "distances" between every other node and the "target" node i. The distance between two nodes is the minimal number of nodes through which one passes to travel from one node to the other, i.e., the number of intervening nodes.

If there are any "leaf" variable nodes, then renormalize 920 a leaf variable node farthest from the "target" node. A node is a leaf node when it is connected to only one other node in the graph. Ties in distance can be broken randomly.

Otherwise, if there are no "leaf" variable nodes, then renormalize 930 a "leaf" check node farthest from the "target" node. Again, ties can be broken randomly.

Otherwise, if there are no "leaf" check nodes, renormalize 940 a variable node from among those farthest from the target node that is directly connected to the fewest number of check nodes. Again, ties can be broken randomly.

The renormalization steps are iteratively repeated until the graph has been reduced down to the desired number of nodes. The details of these steps are described in greater detail below.

The above steps can be applied to as many target nodes as desired; for example, the average failure rate of every node in the graph can be determined. In a practical application, the renormalization is applied to target nodes representative of groups of like nodes. Then, it can be determine if the group of nodes is "strong" or "weak" with respect to its error-correcting capabilities. This information can then be used to improve the overall performance of the error-correcting code. For example, nodes in weak groups can be connected to more parity checks. Thus, the invention provides means for improving error-correcting codes in a structured manner.

The RG Transformation for a Decorated Tanner Graphs with no Cycles

First, we consider loop-free Tanner graphs, and determine the RG transformations that are sufficient to give exact failure rates for such error-correcting codes. Then, we extend the RG transformations in order to obtain good approximate results for Tanner graphs with cycles.

We always initialize our decorated Tanner graph such that all $b_i = x$, $p_{ia} = x$, and all $q_{ai} = 0$. We are interested in the decoding failure rate $b_i$ at the specified target variable node i. Our method 900 obtains $b_i$ by repeatedly renormalizing nodes, one node at the time, as described above, other than the target node i itself.

The first possibility is to renormalize a "leaf" variable node i that is connected to the check node a. Clearly, when that leaf variable node "vanishes," $p_{ia}$ and $q_{ai}$ are also discarded. We also renormalize all the $q_{aj}$ variables leading out of the check node a to other variable nodes j. Our formulation for this renormalization is:

$$q_{aj} \leftarrow 1 - (1 - q_{aj})(1 - p_{ia}) \tag{37}$$

where the left arrow indicates that we replace the old value of $q_{aj}$ with the new value. Notice that each renormalization of $q_{aj}$ increases its value.

When we renormalize a "leaf" check node a that is only connected to a single variable node, we adjust the values of all the $p_{ib}$ variables leading to other checks nodes b to which the variable node i is attached. The renormalization group transformation is $$p_{ib} \leftarrow p_{ib} q_{ai}.$$

Notice that each renormalization of $p_{ib}$ decreases its value. At the same time, we should also renormalize the $b_i$ as follows:

$$b_i \leftarrow b_i q_{ai}. \tag{39}$$

The renormalization of step 940 is described in greater detail below for graphs with cycles.

When only the "target" node i remains, we use the current value of $b_i$ as our RG prediction of the average failure rate. As stated above, these steps can be repeated for any number of target nodes.

EXAMPLE

To better describe the RG method according to our invention, we give the following simple example. Recall the error-correcting code defined by the parity check matrix $$A = \begin{pmatrix} 1 & 1 & 0 & 0 \\ 0 & 1 & 1 & 1 \end{pmatrix}. \tag{40}$$

We desire to determine the decoding failure rate at the second variable node $b_2$. We initialize $p_{11}=p_{21}=p_{22}=p_{32}=p_{42}=x$, $q_{11}=q_{12}=q_{22}=q_{23}=q_{24}=0$, and $b_1=b_2=b_3=b_4=x$.

Figure 1:
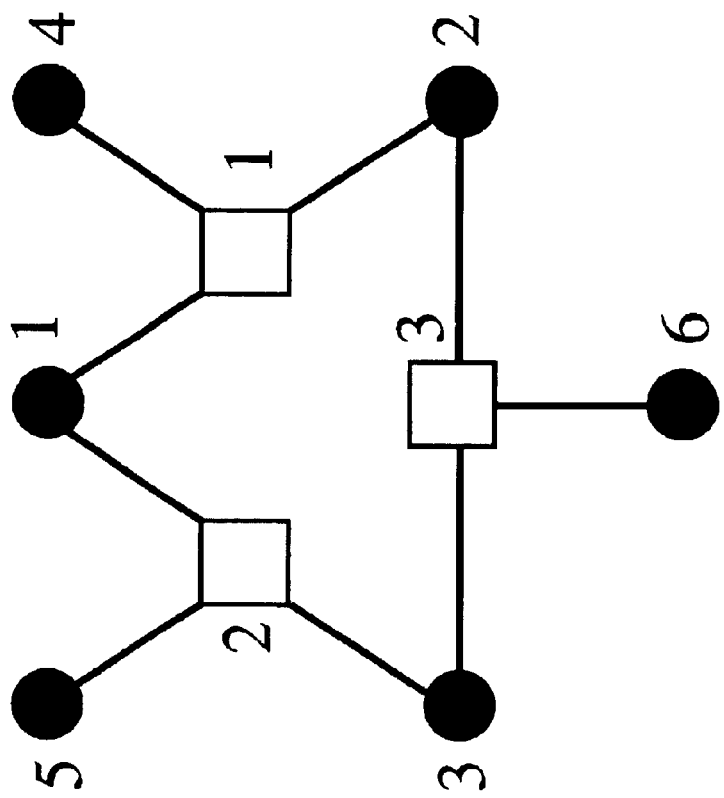
FIG. 1 is a prior art bipartite graph representing an error-correcting code including a cycle.
Figure 2:
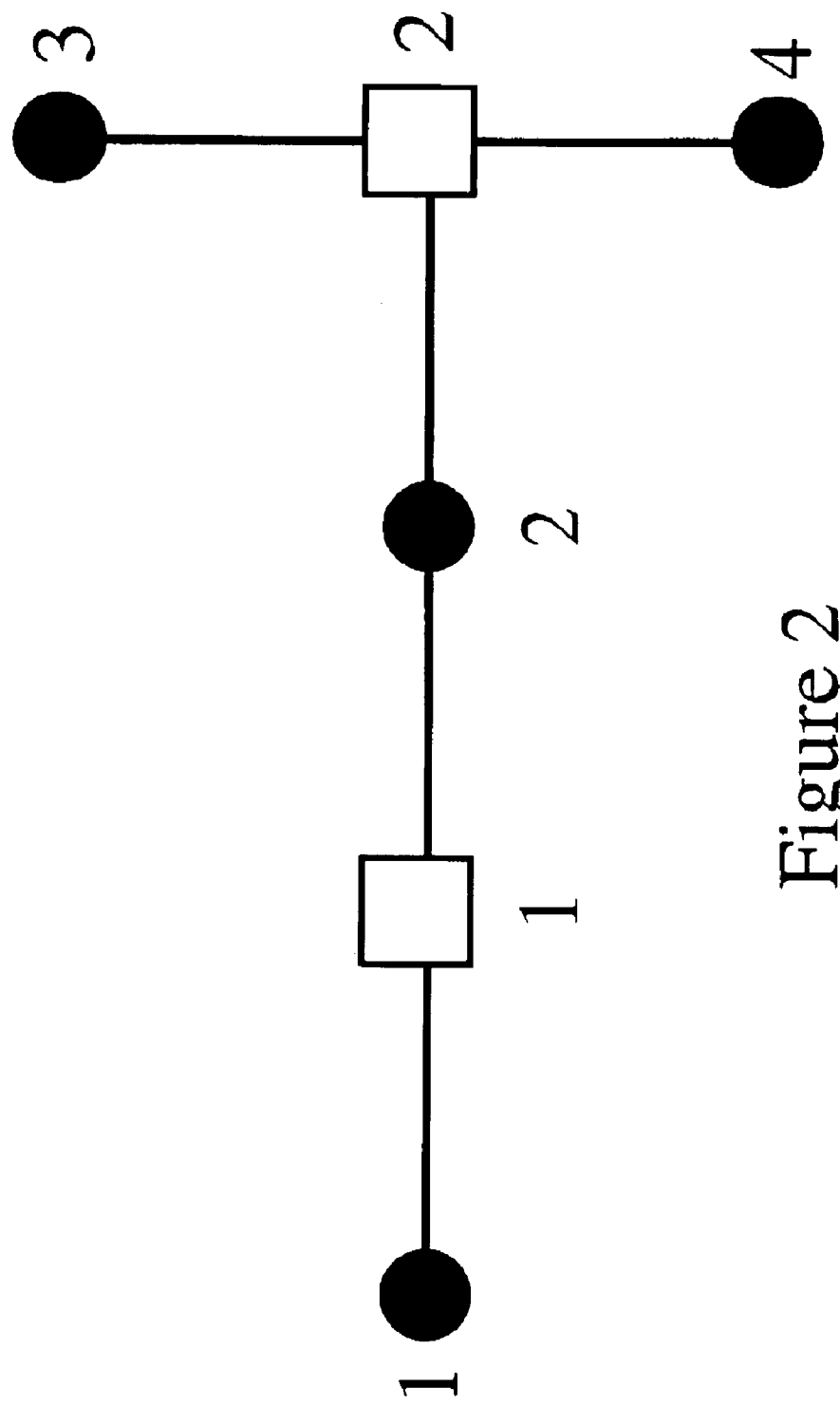
FIG. 2 is a prior art bipartite graph representing a simple prior art error-correcting code.
Figure 3A:
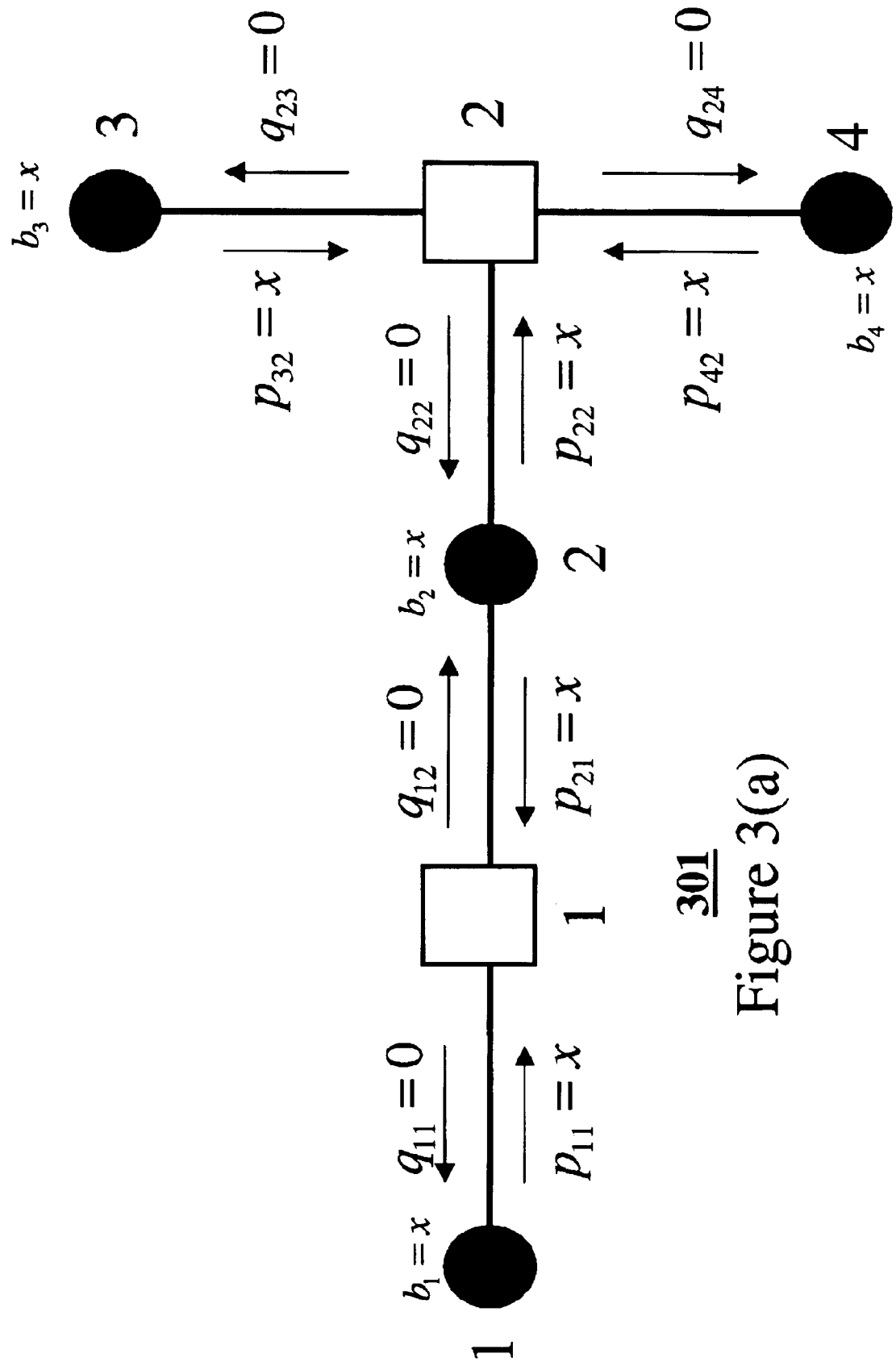
FIGS. 3a–e are bipartite graphs renormalized according to the invention.

As shown in FIG. 3(a), we decorated the Tanner graph for this code. All of the variable nodes other than variable node 2 are leaf nodes, so we can renormalize any of them. According to our general method 900, we renormalize the node farthest from node 2, breaking ties randomly. If we select variable node 4, then we discard $p_{42}$ and $q_{24}$ and obtain new values $q_{22}=x$, and $q_{23}=x$ using equation (37).

Figure 3B:
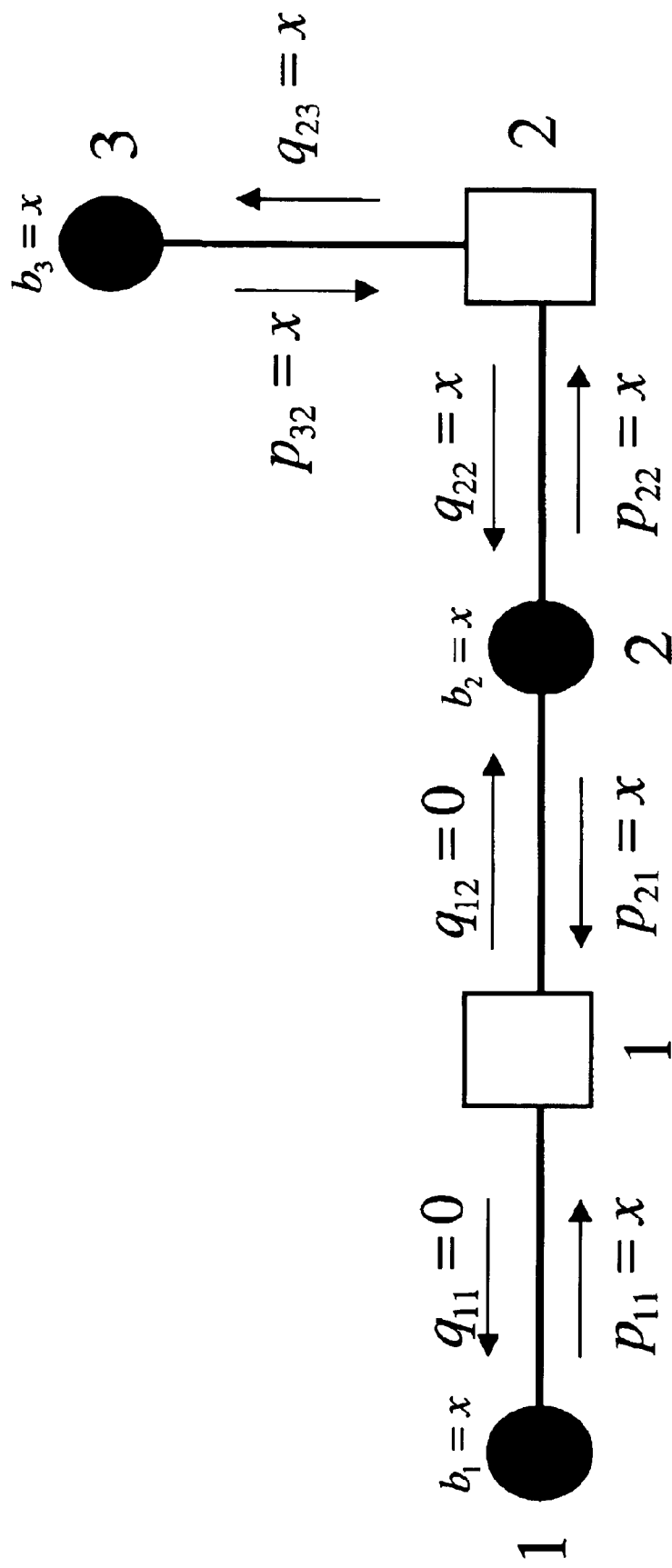
Figure 3C:
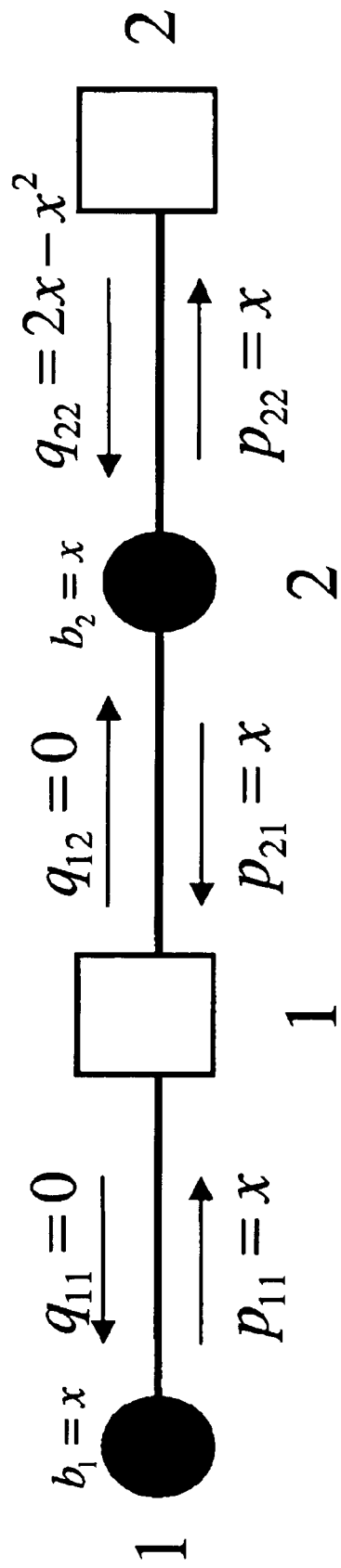
Figure 3D:
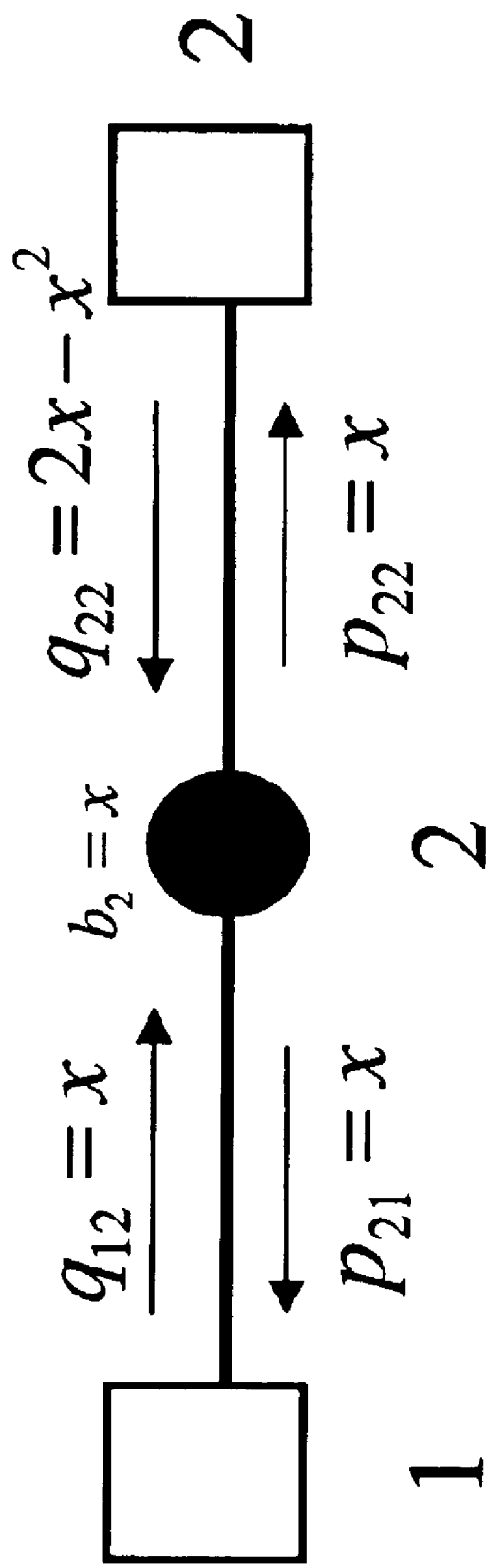
Figure 3E:
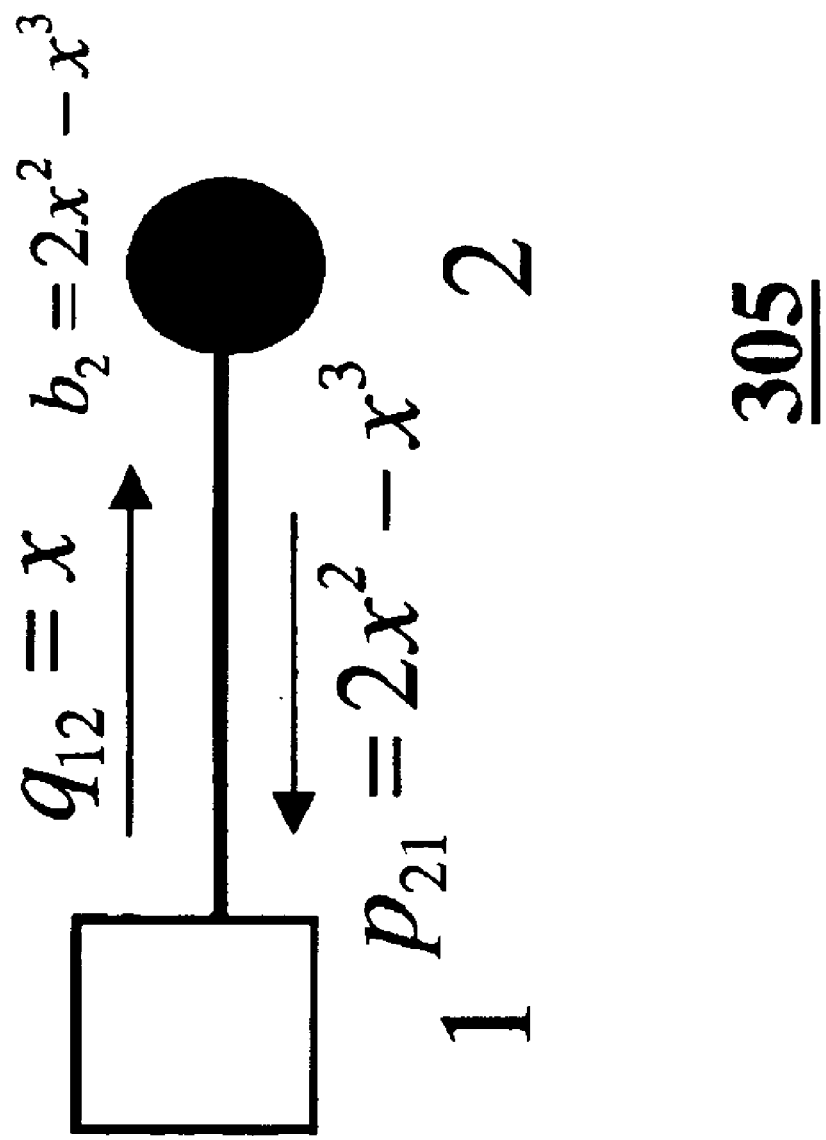

The new reduced size decorated Tanner graph is shown in FIG. 3(b). Next, we renormalize variable node 3. We discard nodes $p_{32}$ and $q_{23}$, and renormalize the value $q_{22}$ to the value $1-(1-x)^2=2x-x^2$. The even smaller decorated Tanner graph is shown in FIG. 3(c). Next we renormalize variable node 1. We discard nodes $p_{11}$ and $q_{11}$, and obtain yet smaller renormalized value $q_{12}=x$. The Tanner graph is shown in FIG. 3(d). Next we renormalize check node 2. We can discard nodes $p_{22}$ and $q_{22}$ and obtain $p_{21}=b_2=2x^2-x^3$ as shown for the Tanner graph in FIG. 3(e). Finally we renormalize check node 1. This leaves us with only a single variable node, our original target node 2, and $b_2$ gets renormalized to its correct failure, $b_2=2x^3-x^4$, as described above.

This example makes it clear why the RG method is exact for a codeword defined on a graph without cycles. The RG transformations essentially reconstruct the density evolution equations of the prior art, and we know that density evolution is exact for such an error-correcting code. The advantage of our RG method is that it gives a much better approximation for error-correcting codes represented by bipartite graphs with cycles. It is well understood, that good error-correcting codes, even of moderate size, will always have cycles, mainly because cycles provide redundancy without substantially increasing the size of the code.

The RG Method for a Graph with Cycles

For an error-correcting code represented by a graph with cycles, we eventually have to renormalize 940 a node that is not a "leaf" node. Note that we never have to renormalize a non-leaf check node. To do this, we first collect all the check nodes a, b, etc. connected to the target node i. We discard $q_{ai}$, $q_{bi}$, $p_{ia}$, $p_{ib}$, etc. For any given check node attached to node i, e.g., check node a, we also collect all the other variable nodes j attached to node a, and renormalize the values of $q_{aj}$.

The renormalization of the $q_{aj}$ variable can be done to varying degrees of accuracy. The simplest method uses equation (37) directly. The problem with this method is that the value of $p_{ia}$ is always an over-estimate. Recall that $p_{ia}$ decreases with every renormalization. Because we are renormalizing the ith node before it has become a leaf node, $p_{ia}$ is not yet been fully renormalized, and is thus over-estimated.

Instead of using $p_{ia}$ directly, we could use the value that it would have after we renormalized all the check nodes connected to it. That is, we could replace $p_{ia}$ in equation (37) with an effective $p_{ia}^{eff}$ given $$p_{ia}^{eff} = p_{ia} \prod_{b \in N(i) \backslash a} q_{bi}. \tag{41}$$

On the other hand, we know that the values of the $q_{bi}$ are under-estimates because they have not yet been fully renormalized either, so $p_{ia}^{eff}$ also is an under-estimate. We could attempt to correct this mistake by going another level further. Before we estimate a $p_{ia}^{eff}$, we first re-estimate the $q_{bi}$ which feed into it. Thus, we replace the $p_{ia}$ in equation (37) with an effective $p_{ia}^{eff}$ given by $$p_{ia}^{eff} = p_{ia} \prod_{k \in N(i) \backslash a} q_{bi}^{eff}. \tag{42}$$

where $q_{bi}^{eff}$ is in turn given by $$q_{bi}^{eff} = 1 - (1 - q_{bi}) \prod_{k \in N(b) \backslash i} (1 - p_{kb}). \tag{43}$$

Putting all these together, we finally get the RG transformation $$q_{aj} \leftarrow 1 - (1 - q_{aj}) \left( 1 - p_{ia} \prod_{b \in N(i) \backslash a} \left[ 1 - (1 - q_{bi}) \prod_{k \in N(b) \backslash i} (1 - p_{kb}) \right] \right). \tag{44}$$

The RG transformation of equation (44) is worth describing in greater detail.

Figure 4:
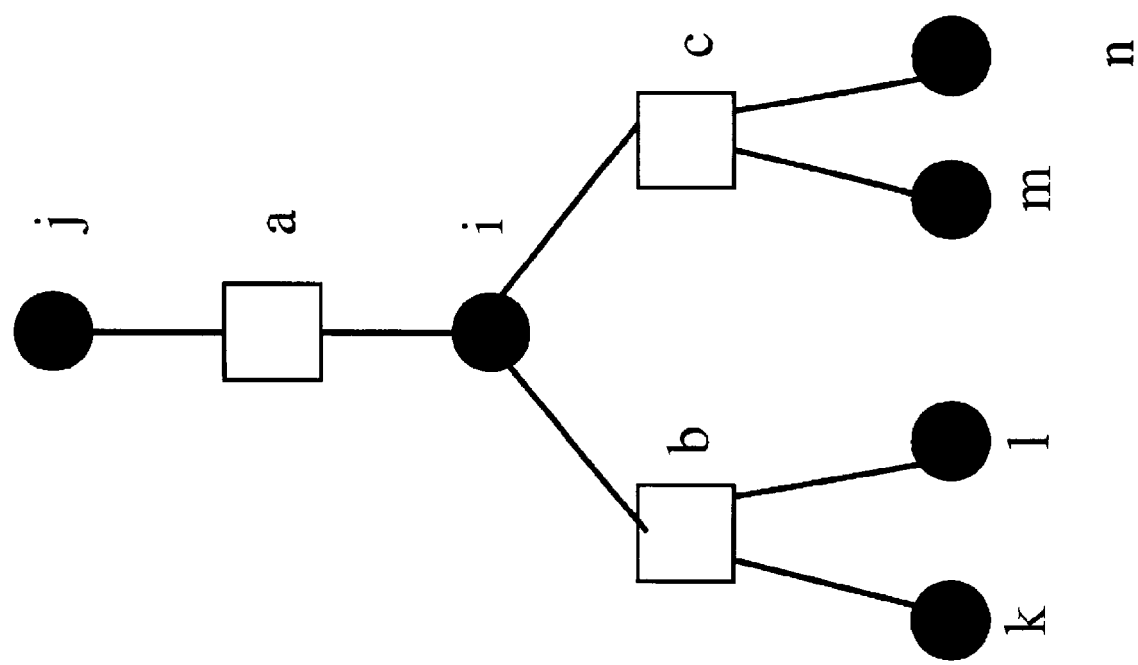
FIG. 4 is a bipartite graph to be renormalized according to the invention.

In FIG. 4, we show the Tanner graph where variable node i is attached to three checks node a, b, and c, and check node a is attached to a variable node j. Check nodes b and c are connected to variable nodes labeled k, l, m, and n. We would like to know the probability $q_{aj}$ that check node a sends variable node j an erasure message, taking into account the information that flows through variable node i.

We already have some previous accumulated probability $q_{aj}$ that check node a sends to variable node j in an erasure message because of other nodes previously attached to check node a that have already been renormalized.

The new probability of an erasure message can be determined from a logical argument:

"$m_{aj}$ is an erasure it was already or if $m_{ia}$ is an erasure and ($m_{bi}$ or $m_{kb}$ or $m_{lb}$ are erasures) and ($m_{ci}$ or $m_{mc}$ or $m_{nc}$ are erasures)."

Converting such a logical argument into an equation for probabilities is straightforward. If we have "$m_1$ and $m_2$" for two independent messages in a logical argument, then we translates these terms to ($p_1$ $p_2$) for the corresponding probabilities, while "$m_1$ or $m_2$" translates to $(1-(1-p_1)(1-p_2))$. Converting our full logical argument for FIG. 4 into an equation for probabilities, enables us to recover an example of the RG transformation of equation (44).

We always have an RG transformation for $q_{aj}$ correspond to the logic of the local neighborhood around the variable node i that we are renormalizing. In fact, the RG transformation given in equation (44) is appropriate if the local neighborhood of node i is tree-like, but should be adjusted if there are cycles in the local neighborhood.

Figure 5:
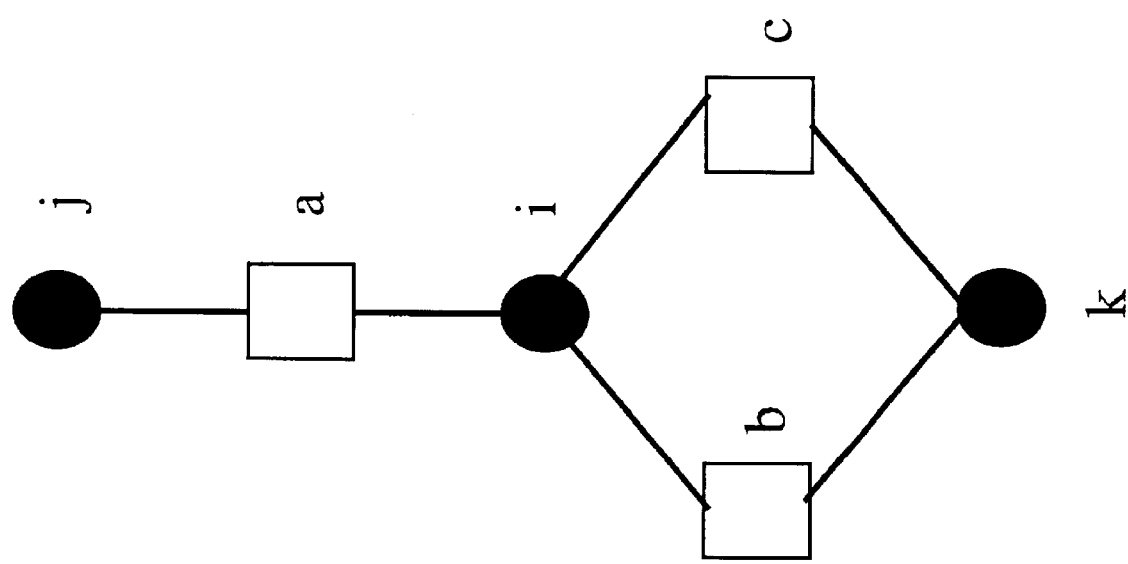
FIG. 5 is a bipartite graph with cycles to be renormalized.

For example, the graph in FIG. 5 shows a case where a variable node k is attached to two check nodes b and c, which in turn are each attached to variable node i that is to be renormalized. Note that before check nodes b or c are renormalized, the probabilities $p_{kb}$ and $p_{kc}$ that variable node k sends out an erasure must be identical, because all renormalizations of $p_{kb}$ and $p_{kc}$ happen in tandem.

Our logic argument for whether check node a sends variable node j an erasure message is thus:

"$m_{aj}$ is an erasure if it was already or if (($m_{ia}$ is an erasure) and (($m_{kb}$ is an erasure) or ($m_{bi}$ and $m_{ci}$ are erasures)))."

At this stage in the renormalization process, if $m_{kb}$ is an erasure, then $m_{kc}$ must be as well. Converting our logic argument into an RG transformation, we get $$q_{aj} \leftarrow 1-(1-q_{aj})(1-p_{ia}(1-(1-p_{kb})(1-q_{bi}q_{ci}))). \quad (45)$$

The step for renormalizing a non-leaf variable node i can be made increasingly accurate by increasing the size of the neighborhood around the node that was treated correctly. Naturally, as we increase the size of the neighborhood, we must pay for the increased accuracy with greater computation.

Figure 10:
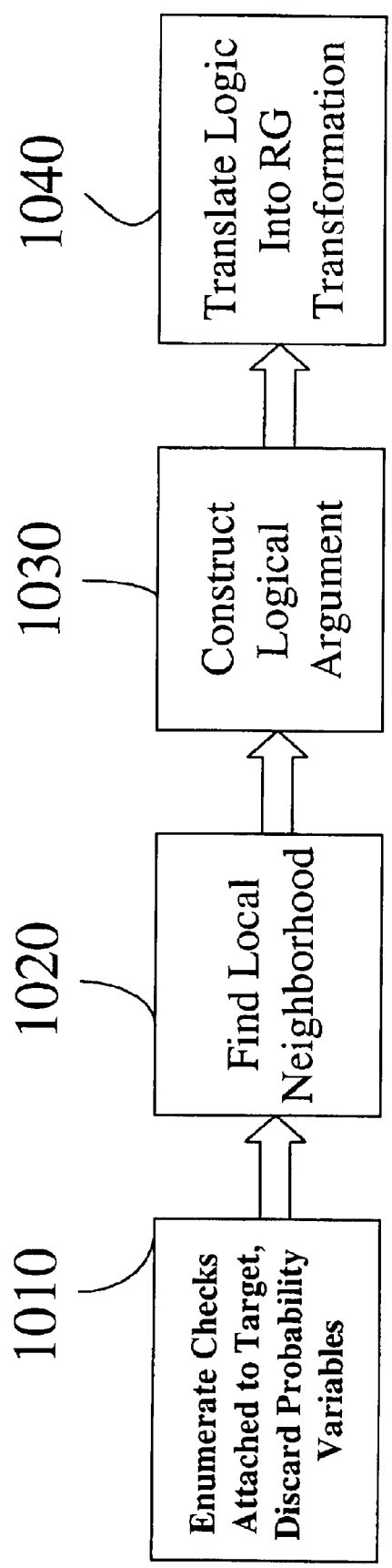
FIG. 10 is a flow diagram of the method according to the invention for a graph with cycles.

FIG. 10 summarizes a method for renormalize a variable node that is not a leaf node, i.e., step 940 of FIG. 9.

Step 1010 enumerates all check nodes a, b, etc. which are connected to the variable node to be renormalized and discards all the probability variables $p_{ia}$, $p_{ib}$, $q_{ai}$, $q_{bi}$, etc. between these check nodes and the variable node.

For each variable node j attached to one of the neighboring check nodes a, renormalize the value of $q_{aj}$ according to the following sub-steps:

Step 1020 finds all check nodes and variable nodes in a local neighborhood to a predetermined distance from the variable node i to be renormalized. The distances are measured as described above.

Use a logical argument to determine 1030 which combinations of erasure messages cause the message from check node a to variable node j to also be an erasure.

Translate 1040 the logical argument into a RG transformation for $q_{aj}$ as describe above.

Finishing the RG Transformation Exactly

As stated above, our RG method can always renormalize nodes until just the "target" node i is left, and then determine the decoding failure rate $b_i$. On the other hand, we can also renormalized a sufficient number of nodes to make an exact determination.

For the purposes of describing the exact determination, we instead represent the error-correcting code by a Tanner graph of N nodes, and an associated erasure probability $x_i$ with each node i of the graph. This "erasure graph" is different than the decorated Tanner graphs 301–305 described above. The decoding failure rate can be determined exactly for an erasure graph, but the exact computation is only practical if the number of nodes in the erasure probability graph is small. We describe how to determine the decoding failure rate exactly for an erasure probability graph, and then describe how to convert a decorated graph according to the invention into an equivalent erasure graph.

To determine exactly the decoding failure rate of a given node i, we generate all $2^N$ possible received messages, ranging from the all-zeros message to the all-erasures message, and decode each of message using the BP decoder.

Each message has a probability $$p=\Pi x_i \Pi (1-x_j) \quad (46)$$

where the first product is over all nodes that are erased and the second product is over all nodes that are not erased. We determine $b_i$ by taking the weighted average over all possible received messages of the probability that node i decodes to an erasure. Because the complexity of the exact calculation is $O(2^N)$, we restricted ourselves to a small N, but nevertheless we can gain some accuracy by switching to an exact calculation after renormalizing sufficient nodes.

The one subtlety in the exact final calculation is that we now represent the error-correcting code by a Tanner graph and associated erasure probabilities $x_i$ at each variable node i. In contrast, the general RG method uses just a decorated Tanner graphs. Fortunately, it is possible to convert a decorated Tanner graph into an erasure graph. Note that at each step of the RG method, all the probabilities $q_{ai}$ leading out of the check node a are equal, i.e., $q_{ai}=q_a$, and all the probabilities $p_{ia}$ leading out the variable node i are equal, i.e., $p_{ia}=p_i$.

We can set all the $q_a$ probabilities equal to zero by adding a new variable node k, with probability of $p_{ka}=q_a$, to node a in the erasure graph. When we are left with a decorated Tanner graph, such that all q probabilities are zero, and all $p_{ia}$ probabilities coming out of each variable node are equal to $p_i$. We interpret $p_i$ as the erasure probabilities of the variable nodes.

Figure 6:
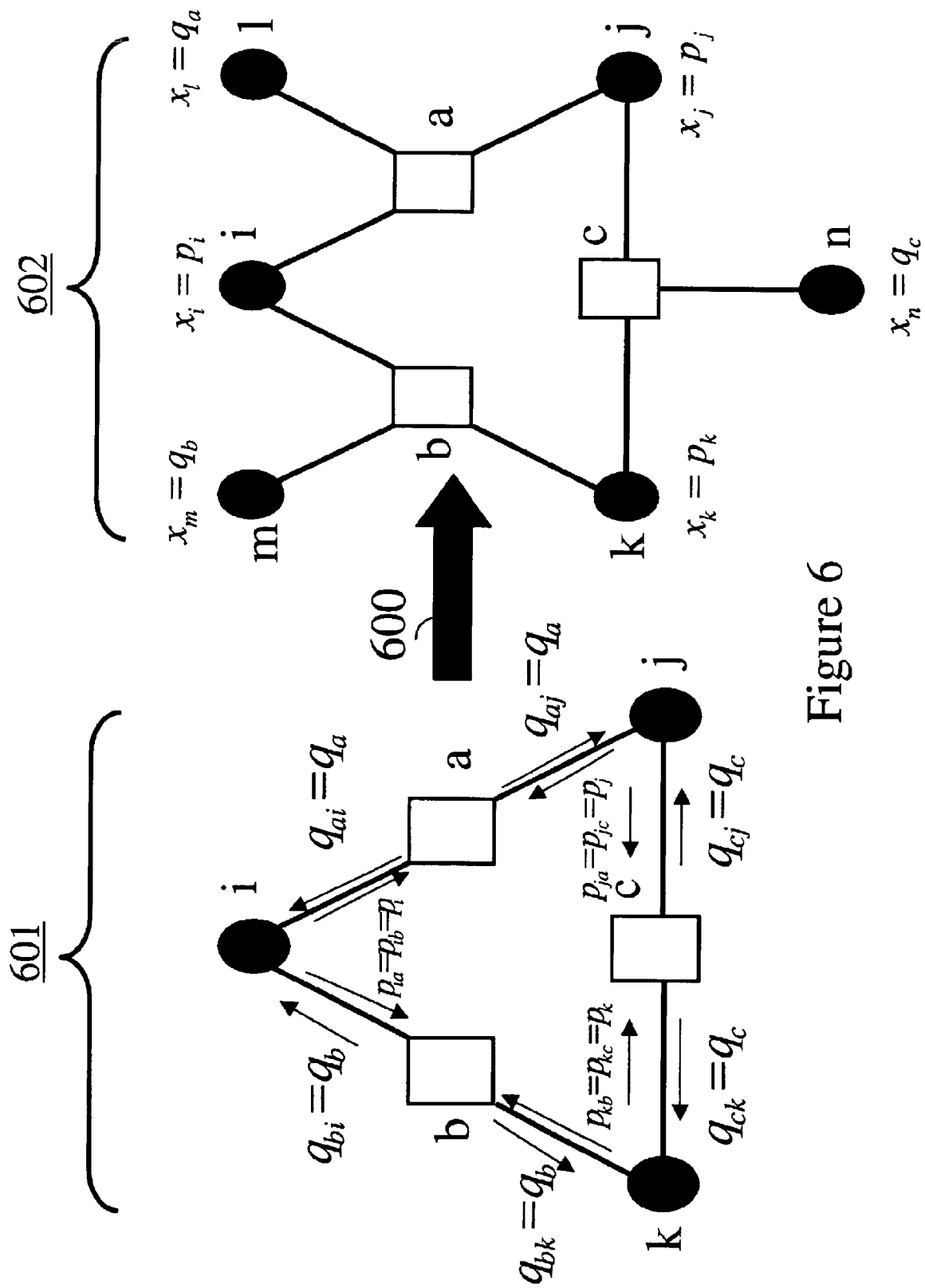
FIG. 6 shows an expansion of a bipartite graph to be renormalized.

FIG. 6 shows an example of expanding a decorated Tanner graph 601 to an equivalent erasure Tanner graph 602 with erasure probabilities.

Extension to Generalized Parity Check Matrices

Generalized parity check matrices define many of the modem error-correcting codes, such as turbo-codes, Kanter-Saad codes, and repeat-accumulate codes. In the generalized parity check matrix, additional columns are added to a parity check matrix to represent "hidden" nodes. Hidden nodes have state variables that are not passed to other nodes, i.e., the states of the hidden nodes are "hidden." A good notation for the hidden state variables is a horizontal line above the corresponding columns. For example, we write $$A = \begin{pmatrix} \overline{1} & 1 & 0 & 1 & 0 & 0 \\ 1 & 0 & 1 & 0 & 1 & 0 \\ 0 & 1 & 1 & 0 & 0 & 1 \end{pmatrix} \quad (47)$$

to indicate a code where the first variable node is a hidden node. To indicate that a variable node is a hidden node in our graphical model, we use an open circle rather than a filled-in circle. Such a graph, which generalizes Tanner graphs, is called a "Wiberg graph," see N. Wiberg, "Codes and decoding on general graphs," Ph. D. Thesis, University of Linkoping," 1996, and N. Wiberg et al., "Codes and iterative decoding on general graphs," Euro. Trans. Telecomm, Vol. 6, pages 513–525, 1995.

Figure 7:
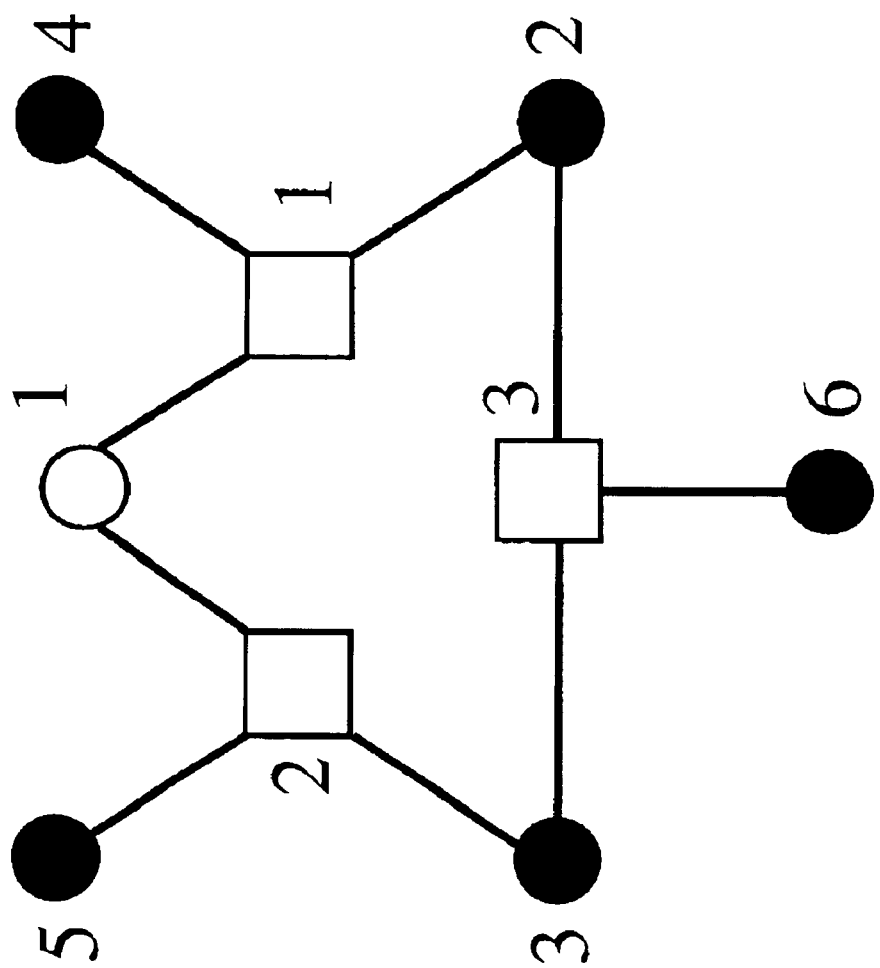
FIG. 7 is a bipartite graph with a cycle representing a generalized parity check matrix to be renormalized.

FIG. 7 shows a Wiberg graph representing an error-correcting code defined by the generalized parity check matrix or equation (47).

The generalization our RG method 900 to handle Wiberg graphs, we initialize the probabilities $p_{ia}$ coming out of a hidden node to one, instead of at the erasure rate x, as we do for ordinary transmitted variable nodes. This reflects the fact that hidden nodes are always erased, while ordinary variable nodes are erased with a probability of x.

Comparison with Numerical Simulations

We now describe some experimental predictions of our RG method. We define a (3,5) regular Gallager error-correcting code by a parity check matrix corresponding with N=60 and k=36. That is, each of the 36 rows in the parity check matrix has five entries that are ones, and the rest are zeros, and each of the 60 columns has three entries that are zeros. There are no hidden nodes. No two parity checks share more than one variable node. This means that all local neighborhoods of nodes are tree-like. Therefore, we use the RG transformation (44) whenever we renormalize a non-leaf variable node. We renormalized nodes until we are left with seven nodes, and then finish the determination exactly.

We consider erasure rates x at intervals of 0.05 between x=0 and x=1. When we use the RG approximation, we average our decoding failure rates $b_i$ over all nodes i to get an overall bit error rate. Our experiment includes a thousand trials at each erasure rate, while we decode according to the standard BP decoding method.

Figure 8:
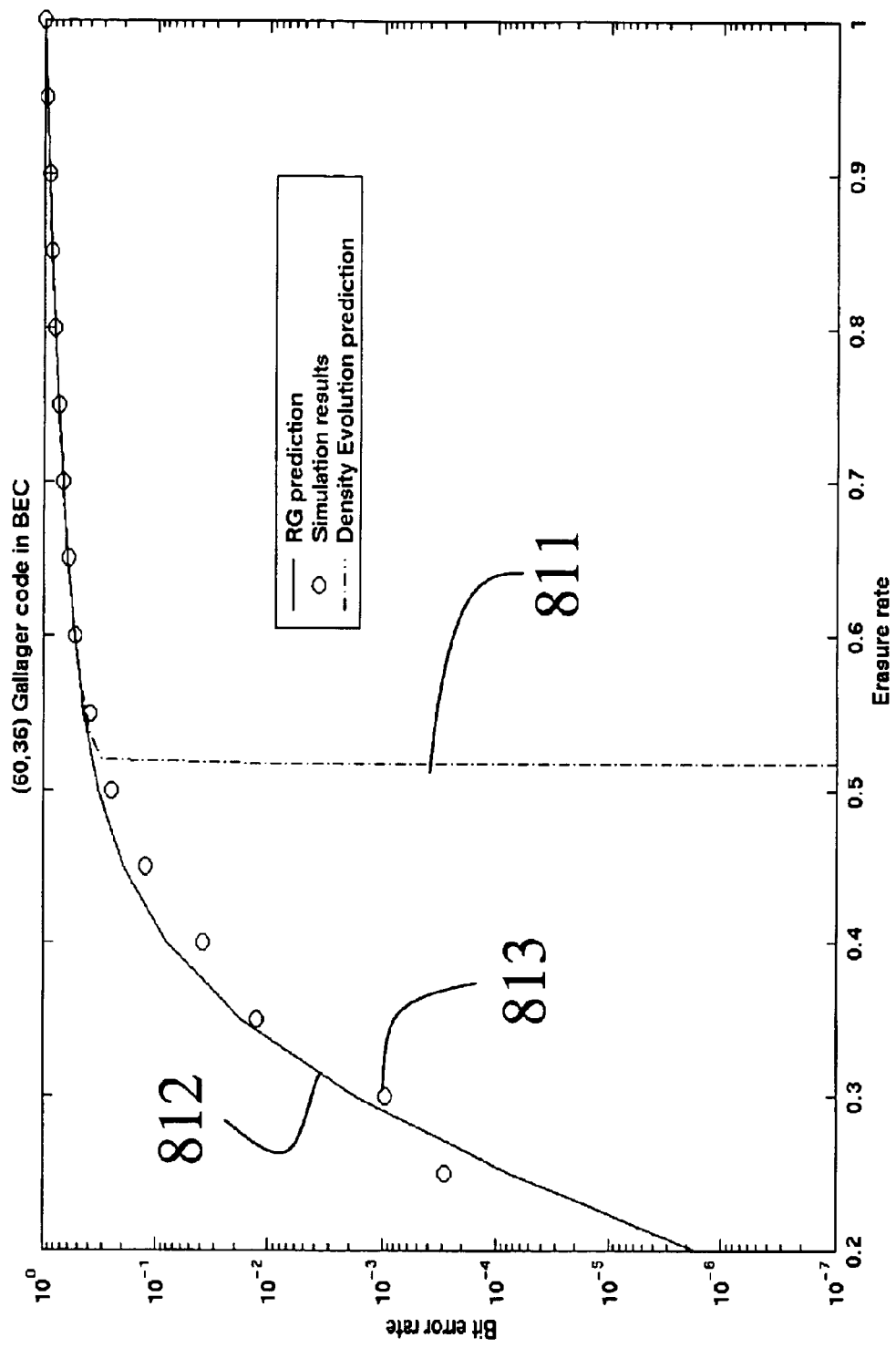
FIG. 8 is a graph comparing methods of evaluating error-correcting codes.

FIG. 8 shows our experimental results. In FIG. 8, the x-axis is the erasure rate, and the y-axis the bit error rate. Curve 811 is the prior art density evolution prediction, curve 812 the RG theoretical prediction, and the open circles 813 our experimental results. FIG. 8 clearly shows that the density-evolution prediction has a threshold-like behavior and is completely incorrect for small or medium block-lengths, whereas the RG method according to the invention is not.

Extension to a Gaussian Noise Channel

We extend our RG method so that it can also be used with an additive white Gaussian noise (AWGN) channel. We do this by adapting a Gaussian approximation to density evolution for the AWGN channel as described by Chung, et. al. in "Analysis of Sum-Product Decoding of Low-Density Parity-Check Codes Using a Gaussian Approximation," IEEE Trans. Info. Theory, Vol. 47, No.2, pages 657–670, 2001. We first describe that approximation.

In the AWGN channel, there are only two possible inputs, 0 and 1, but the output is a set of real numbers. If x is the input, then the output is $y=(-1)^x+z$, where z is a Gaussian random variable with zero mean and variance $\sigma^2$. For each received bit i in the code, the log-likelihood ratio $m_i^0=\ln(p(y_i|x_1=0)/p(y_i|x_1=1))$ determines the relative log-likelihood ratio that the transmitted bit i was a zero, given the received real number is $y_i$.

The error-correcting code is defined by the generalized parity check matrices, as described above. The all-zeros codewords are transmitted, and the decoding process is the sum-product belief propagation process. In this decoding process, real-valued messages are iteratively solved as functions of each other. The types of real-valued messages which are used are $m_{ia}$ from variable nodes i to check nodes a; and $m_{ai}$ from check nodes a to variable nodes i.

The messages $m_{ia}$ are log-likelihood ratios by which the variable node i informs the check node a of its probability of being either a zero or a one. For example, $m_{ia} \to \infty$ means that node i is certain it is a zero, while $m_{ia}=1$ means that variable node i is signaling check node a that $\ln(p(x_1=0)/p(x_1=1))=1$.

The messages $m_{ai}$ are log-likelihood ratios interpreted as information from the check node a to the variable node i about the state of variable node i.

In sum-product decoding, the messages are iteratively solved according to the update rules:

$$m_{ia} = \sum_{b \in N(i) \setminus a} m_{bi} + m_i^0, \qquad (48)$$

if node i is a hidden node, the $m_i^0$ is omitted, and $$\tanh(m_{ai}/2) = \prod_{j \in N(a) \setminus i} \tanh(m_{ja}/2). \qquad (49)$$

In the density evolution method for the AWGN channel, one considers the probability distributions $p(m_{ia})$ and $p(m_{ai})$ for the messages where the probability distribution is an average over all possible received blocks. A distribution $f(x)$ is called consistent if $f(x)=f(-x)e^x$ for all x. The consistency condition is preserved for the message probability distributions for all messages under sum-product decoding.

If the probability distributions $p(m_{ia})$ and $p(m_{ai})$ are approximated as Gaussian distributions, then the consistency condition means that the means, $\mu$, of these distributions are related to the variances $\sigma^2$ by $\sigma^2=2\mu$. This means that the message probability distributions can be characterized by a single parameter: their mean.

Thus, by making the approximation that the message probability distributions are Gaussians, the density evolution equations for the AWGN channel can be reduced to self-consistent equations for the means $u_{ia}$ of the probability distributions of messages from variable nodes i to check nodes a, and the means $v_{ai}$ of the probability distributions of messages from check nodes a to variable nodes i. These equations are $$v_{ia} = u^0 + \sum_{b \in N(i) \setminus a} u_{bi} \qquad (50)$$

where $u^0$ is the mean value of $m_i^0$, and is omitted for hidden nodes, and $$\phi(u_{ai}) = 1 - \prod_{j \in N(a) \setminus i} (1 - \phi(v_{ja})), \qquad (51)$$

where $\phi(x)$ is a function defined by $$\phi(x) \equiv 1 - \frac{1}{\sqrt{4\pi x}} \int_{-\infty}^{\infty} \tanh\frac{u}{2} e^{-\frac{(u-x)^2}{4x}} du. \qquad (52)$$

RG Transformations for the AWGN Channel

The density evolution equations (50) and (51) for the AWGN channel under the Gaussian approximation are analogs of the density evolution equations (4) and (3) for the BEC channel. Our RG procedure for the AWGN channel is substantially the same as for the BEC channel. The main difference is that we change the RG transformations.

Just as before, we construct a set of RG transformations which exactly reproduce the density evolution equations for a tree-like graph. We generate a decorated Tanner/Wiberg graph for the code by keeping $u_{ai}$ and $v_{ia}$ variables between each pair of connected nodes. The $u_{ai}$ variables are initialized to infinity, while the $v_{ia}$ variables are initialized to $u^0$, unless the ith node is a hidden node, in which case the $v_{ia}$ are initialized to zero. We also introduce the variables $h_i$ analogous to $b_i$ in the BEC, which are initialized like the $v_{ia}$ variables.

If we renormalize a leaf check node a connected to a variable node i, then we find the other check nodes b attached to i and apply the RG transformations $$v_{ib} \leftarrow v_{ib} + u_{ai} \quad (53)$$

and $$h_i \leftarrow h_i + u_{ai}.$$

If we renormalize a leaf variable node i connected to a check node a, we find the other variable nodes j attached to check node a and apply the RG transformation $$u_{aj} \leftarrow \phi^{-1}(1-(1-\phi(u_{aj}))(1-\phi)(v_{ia}))). \quad (55)$$

Note that with each renormalization of $v_{ib}$, the magnitude of $v_{ib}$ increases, while with each renormalization of $u_{aj}$, and the magnitude of $u_{aj}$ decreases.

When we renormalize a non-leaf variable node i which is connected to check nodes a, b, etc., we renormalize the variables like $u_{aj}$, where j is another variable node connected to check node a. Just as for the BEC, we consider a local neighborhood of nodes around the node i. For example, if the neighborhood of check nodes connected to i and other variable nodes connected to those check nodes is tree-like, we use the RG transformation $$u_{aj} \leftarrow \phi^{-1}(1-(1-\phi(u_{aj}))(1-\phi(v_{ia}^{\text{eff}}))), \quad (56)$$

where $$v_{ia}^{\text{eff}} = v_{ia} + \sum_{b \in N(i) \setminus a} \phi^{-1}\left(1 - (1-\phi(u_{bi})) \prod_{k \in N(b) \setminus i} (1-\phi(v_{kb}))\right). \quad (57)$$

The RG method proceeds as in the BEC case, until the determination of the bit error rate. For the AWGN channel, it is normally inconvenient to stop the RG method before renormalizing all the way down to the "target" node, because it is not simple to do an exact computation even with just a few nodes in the graph.

When we have renormalized all but our target node i, we are left with a final renormalized value of $h_i$. The Gaussian approximation tells us that the probability distribution for the node i being decoded as a zero is a Gaussian with mean $h_i$ and variance $2h_i$. Decoding failures correspond to those parts of the probability distribution which are below zero. Thus, our prediction for the bit error rate ($\text{ber}_i$) at node i is $$\text{ber}_i = \frac{1}{\sqrt{8\pi h_i}} \int_{-\infty}^{0} e^{-\frac{(x-h_i)^2}{4h_i}} dx. \quad (58)$$

Generating Error-Correcting Codes

Given that the density evolution method has been used as a guide to generate the best-known practical error-correcting codes, we can generate even better codes using our RG method. With the RG method according to our invention, we can input a code defined by an arbitrary generalized parity check matrix, and obtain as output a prediction of the bit error rate at each node.

We can use this output in an objective function for a guided search through the space of possible improved code.

For example, we can try to find a N=100 blocklength, transmission rate ½ code with no hidden states that achieves a bit error rate of less than $10^{-4}$ at the smallest possible signal-to-noise ratio for the AWGN channel. We do this by iteratively evaluating codes of the correct blocklength and rate, using our RG method, and using any known search techniques, e.g., greedy descent, simulated annealing, genetic process, etc. to search through the space of valid parity check matrices.

Because we directly focus on the correct measure of merit, i.e., the bit error rate itself, rather than the threshold in the infinite block-length limit, the search according to the invention improves on the results obtained using the prior art density evolution process. We can guide the search because we have information about the bit error rate at every node. For example, it might make sense to "strengthen" a weak variable node with a high bit error rate by adding additional parity check nodes, or we can "weaken" strong nodes with a low bit error rate by turning the weak nodes into hidden nodes, thus increasing the transmission rate.

On the other hand, determining the bit error rate of every node slows down a search. It may be worthwhile, at least for large block-lengths, to restrict oneself to those codes for which there are only a small number of different classes of nodes, defined in terms of the local neighborhoods of the nodes. Most of the best-known codes are of this type. Rather than determining the bit error rate for every variable node, we can determine the bit error rate for just one representative node of each class of variable nodes.

For example, for a regular Gallager code, each node has the same local neighborhood, so any node can be selected as a representative of all the nodes in the neighborhood. The error made in this method is estimated by comparing bit error rates of different nodes of the same class. For actual finite-sized regular Gallager codes, we find that the RG method gives very similar predictions for each of the nodes, so that the error made by just considering a single variable node as a representative of all of them is quite small.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for evaluating an error-correcting code for a data block of a finite size, comprising;

defining an error-correcting code by a parity check matrix;

representing the parity check matrix as a bipartite graph;

iteratively renormalizing a single node in the bipartite graph until a predetermined threshold is reached; and wherein the bipartite graph includes variable nodes representing variable bits of the data block, and check nodes representing parity bits of the data block, and the renormalizing further comprises:

selecting a particular variable node as a target node;

selecting a particular node to be renormalized;

measuring a distance between the target node and every other node in the bipartite graph;

if there is at least one leaf variable node, renormalizing a particular leaf variable node farthest from the target node, otherwise if there is at least one leaf check node, renormalizing a particular leaf check node farthest from the target node, otherwise renormalizing a non-leaf variable node farthest from the target node and having fewest directly connected check nodes.

2. The method of claim 1 wherein the predetermined threshold is a minimum number of remaining nodes.

3. The method of claim 1 wherein the bipartite graph is cycle-free.

4. The method of claim 1 wherein the bipartite graph includes at least one cycle.

5. The method of claim 1 wherein a transmission channel is a binary erasure channel, and further comprising:

decorating the bipartite graph with numbers $p_{ia}$ representing probabilities of messages from variable nodes to check nodes and with numbers $q_{ai}$ representing probabilities of messages from check nodes to variable nodes, and the renormalizing of the non-leaf variable node further comprises:

enumerating all check-nodes a which are connected to the non-leaf variable node;

enumerating all other variable nodes j attached to the check nodes a; and transforming the numbers $q_{aj}$.

6. The method of claim 5 wherein the transforming of the numbers $q_{aj}$ further comprises:

enumerating all check nodes and variable nodes out to a predetermined distance from the target node;

constructing a logical argument to determine combinations of erasure causing a particular message from the check node a to the variable node j to be an erasure;

translating the logical argument into a transformation for the number $q_{aj}$.

7. The method of claim 6 further comprising:

terminating the renormalizing upon reaching the predetermined threshold by an exact determination.

8. The method of claim 7 wherein the remaining bipartite graph includes N nodes in the exact determination, and further comprising:

converting the decorated graph with numbers $q_{ai}$ and $p_{ia}$ into an erasure graph with an erasure probability $x_i$ with each node i of the bipartite graph;

generating all $2^N$ possible messages; and decoding each of the $2^N$ messages using a belief propagation decoder, where each message has a probability $p=\Pi x_i \Pi(1-x_j)$.

9. The method of claim 5 wherein all the numbers $q_{ai}$ are initialized to zero, and all the numbers $p_{ia}$ are initialized to an erasure rate of the transmission channel.

10. The method of claim 5 further comprising:

defining the error-correcting code by a generalized parity check matrix wherein columns represent variable bits and rows define parity bits, and wherein an overbar is placed above columns representing hidden variable bits which are not transmitted; and representing the hidden variable bits by hidden nodes in the bipartite graph.

11. The method of claim 10 wherein the transmission channel is a binary erasure channel and wherein the error-correcting code is defined by a generalized parity check matrix, and further comprising:

initializing the numbers $p_{ia}$ for hidden nodes i to one.

12. The method of claim 5 wherein the transmission channel is an additive white Gaussian noise channel, and further comprising:

representing messages between nodes in the bipartite graph by Gaussian distributions.

13. The method of claim 1, and further comprising:

selecting a set of criterion by which to evaluate error-correcting codes;

generating a plurality of error-correcting codes; and searching the plurality of error-correcting codes for an optimal error-correcting code according to the set of criterion.

14. The method of claim 13, and further comprising:

evaluating an error rate for each error-correcting code at a plurality of nodes; and generating the optimal error-correcting code according to the evaluated error-rate.

15. The method of claim 1 further comprising:

evaluating an error rate for the renormalized bipartite graph.

16. A method for evaluating an error-correcting code for a data block of a finite size, comprising:

defining an error-correcting code by a parity check matrix;

representing the parity check matrix as a bipartite graph, wherein the bipartite graph includes variable nodes representing variable bits of the data block, and check nodes representing parity bits of the data block;

iteratively renormalizing a single node in the bipartite graph until a predetermined threshold is reached, wherein the renormalizing further comprises:

selecting a particular variable node as a target node; and selecting a particular node to be renormalized;

measuring a distance between the target node and every other node in the bipartite graph;

if there is at least one leaf variable node, renormalizing a particular leaf variable node farthest from the target node, otherwise if there is at least one leaf check node, renormalizing a particular leaf check node farthest from the target node, otherwise renormalizing a non-leaf variable node farthest from the target node and having fewest directly connected check nodes;

wherein a transmission channel is a binary erasure channel, and further comprising:

decorating the bipartite graph with numbers $p_{ia}$ representing probabilities of messages from variable nodes to check nodes and with numbers $q_{ai}$ representing probabilities of messages from check nodes to variable nodes, and the renormalizing of the non-leaf variable node further comprises:

enumerating all check-nodes a which are connected to the non-leaf variable node;

enumerating all other variable nodes j attached to the check nodes a;

wherein the enumerating further comprises:

enumerating all check nodes and variable nodes out to a predetermined distance from the target node;

constructing a logical argument to determine combinations of erasures causing a particular message from the check node a to the variable node j to be an erasure;

translating the logical argument into a transformation for the number $q_{aj}$; and transforming the numbers $q_{aj}$.

* * * * *